United States Patent [19]

Neugebauer

[11] Patent Number: 5,504,444
[45] Date of Patent: Apr. 2, 1996

[54] DRIVER CIRCUITS WITH EXTENDED VOLTAGE RANGE

[75] Inventor: Charles F. Neugebauer, San Jose, Calif.

[73] Assignee: Arithmos, Inc., Santa Clara, Calif.

[21] Appl. No.: 185,540

[22] Filed: Jan. 24, 1994

[51] Int. Cl.$^6$ .................... H03F 3/16; H03F 3/45
[52] U.S. Cl. .................... 327/108; 327/379; 327/387; 327/545; 327/563; 323/315; 330/288
[58] Field of Search .................... 307/270, 296.6, 307/296.8, 296.4, 542, 572, 575, 576, 584, 585, 494, 497; 323/315; 327/108, 387, 545, 546, 310, 379, 561, 562, 563, 65; 345/98; 330/257, 288

[56] References Cited

U.S. PATENT DOCUMENTS

| | | | |
|---|---|---|---|
| 4,251,743 | 2/1981 | Hareyama | 307/296.6 |
| 4,471,292 | 9/1984 | Schenck | 307/296.8 |
| 4,571,506 | 2/1986 | Lisco | 307/270 |
| 4,645,945 | 2/1987 | de Sartre | 307/270 |
| 4,659,944 | 4/1987 | Miller, Sr. et al. | 327/53 |
| 4,795,917 | 1/1989 | Scott et al. | 307/270 |
| 4,937,469 | 6/1990 | Larson et al. | 307/296.6 |
| 5,027,181 | 6/1991 | Larik et al. | 307/542 |
| 5,055,719 | 10/1991 | Hughes | 307/296.8 |
| 5,099,156 | 3/1992 | Delbruck et al. | |
| 5,111,071 | 5/1992 | Kwan et al. | 327/53 |
| 5,136,184 | 8/1992 | Deevy | 327/77 |
| 5,177,374 | 1/1993 | Carpenter et al. | 307/270 |
| 5,311,115 | 5/1994 | Archer | 323/315 |

OTHER PUBLICATIONS

C. Mori et al., 'High Voltage Switching P-Channel Structure for CMOS Architectures,' Journal de Physique, Colloque C4, Supplement Au n.9, vol. 49, pp. C4-753 through C4-756, 1988.

M. J. Declercq et al., '5V-to-75V CMOS Output Interface Circuits,' IEEE International Solid-State Circuits conference, pp. 162-163, 1993.

M. G. Degrauwe et al., 'Adaptive Biasing CMOS Amplifiers,' IEEE Journal of Solid-State Circuits, vol. SC-17, No. 3, pp. 522-528, 1982.

Z. Parpia et al., 'Modeling and Characterization of CMOS-Compatible High-Voltage Device Structures,' IEEE Transactions on Electron Devices, vol. ED-34, No. 11, pp. 2335-2343, 1987.

Primary Examiner—Timothy P. Callahan
Assistant Examiner—Eunja Shin
Attorney, Agent, or Firm—Lyon & Lyon

[57] ABSTRACT

Novel high voltage amplifiers that are capable of being monolithically integrated using low voltage semiconductor fabrication processes are described and claimed. A cascade of low voltage current mirrors is described that can act as a high voltage amplifier output circuit. A high voltage current source circuit also is described and is constructed from the series combination of a low voltage transistor and a parasitic field oxide transistor. Additionally, a differential amplifier having bias current shunting transistors is described that can be used to limit quiescent current from the power supply of the high voltage amplifiers.

37 Claims, 7 Drawing Sheets

DRIVER CIRCUITS WITH EXTENDED VOLTAGE RANGE

TECHNICAL FIELD

The present invention relates to methods and apparatus for driving high voltage loads with low voltage components.

BACKGROUND OF THE INVENTION

Many electronic systems utilize high voltage signals that exceed the 5V or less logic signal levels of typical digital systems. For example, applications such as communications systems that incorporate modems, serial line drivers, etc., may be required to operate at elevated voltage levels. In many flat panel displays, row and column electrodes are driven by low cost integrated circuits ('ICs') that must be capable of driving high voltages. Many types of nonvolatile semiconductor memories, e.g. EPROMs, EEPROMs and flash EEPROMs, require on-chip manipulation of high voltage signals in order to control programming. Implantable electronic medical devices, such as pacemakers, often require signal or output voltages in the range of 5V to 40V.

Conventional monolithic high voltage amplifier circuits have been fabricated in special Complimentary Metal-Oxide Semiconductor ("CMOS") processes that permit high voltage operation, since transistors fabricated in conventional low voltage CMOS processes typically break down at voltages around 6V to 10V. Transistor breakdown is due to phenomenon such as zener breakdown of the drain, short channel effects and gate oxide failure. J. Y. Chen, CMOS Devices and Technology for VLSI, Prentice Hall, Englewood Cliffs, N.J., 1990; S. M. Sze, Semiconductor Devices Physics and Technology, John Wiley & Sons, New York, 1985. Double diffused drain structures, thicker oxides and long channel Field Effect Transistors ("FETs") have been used in high voltage processes to achieve higher voltage break down levels. But these modifications result in characteristically larger transistors, i.e. a minimum transistor length greater than about 1.5 µm as compared to less than 0.5 µm for low voltage transistors. Larger transistors limit the integration density of the transistors.

Integrated circuits are generally fabricated with standard (also known in the art as "commodity") CMOS processes that are less expensive than specialty high voltage CMOS processes, but are only capable of reliably supporting voltages at or below 5 volts. Combining large, high voltage transistors with small, low voltage transistors on the same semiconductor substrate can be relatively expensive as a result of additional mask steps in the IC fabrication process. Therefore, specialty fabrication of conventional high voltage circuits raises the cost of manufacturing for applications that require extended voltage ranges.

Integrated circuits that implement high voltage circuitry using a low voltage fabrication process have been reported, but with limited applicability. In these circuits, high voltage n-Field Effect Transistors ("n-FETs") and p-FETs are fabricated by extending the drain terminal of the FETs with lightly doped parasitic implants. See Z. Parpia, C.A.T. Salama and R. A. Hardaway, 'Modeling and Characterization of CMOS-Compatible High-Voltage Device Structures,' IEEE Transactions on Electron Devices, Vol. ED-34, No. 11, 1987, pp. 2335–2343; M. J. Declercq, M. Schubert and F. Clement, '5V-to-75V CMOS Output Interface Circuits,' Proceedings of the International Solid State Circuits Conference, San Francisco, 1993, pp. 162–163. These high voltage FETs have lightly doped drain-to-substrate diodes which diodes for standard CMOS fabrication processes typically can sustain voltages of over 40V. These high voltage n-FETs and p-FETs can be used in operational amplifiers and buffer circuits with conventional transistor arrangements.

One of the problems the devices described by Parpia et al. and Declercq et al. have is that the gate oxide between the low voltage gate and the high voltage drain is a thin oxide, which cannot reliably withstand voltages above 5V for most small geometry CMOS processes. Fabricating high voltage devices using small device geometries (i.e. sub micron transistor length) can degrade the transistor significantly and impact long term reliability, if the transistors must sustain voltages above 5V. This degradation is due to the phenomenon of electron tunneling, avalanche breakdown and charge retention in oxide traps. For this reason, previously described high voltage circuits have been restricted to relatively large geometry (i.e. greater than 1.5 µm minimum transistor length) low voltage CMOS processes, a restriction that hinders the integration density and hence applicability of the circuits.

Another problem with the previously described devices is the large gate-to-drain capacitance caused by the overlap of the drain and gate regions. Since the lightly doped parasitic implants are not self-aligned with the gate, as is the case with conventionally fabricated transistors, the overlap and hence capacitance of these transistors can be significantly larger than that of self-aligned transistors. These large capacitances can significantly limit the speed of the transistors.

For applications in which power consumption is a concern, such as battery-powered devices, amplifiers that minimize power-supply currents and have low power-supply voltage operation are desirable. Examples of conventional micropower operational amplifier designs are described in P. E. Allen and D. R. Holberg, CMOS Analog Circuit Design, Holt, Rinehart and Winston, New York, 1987, pp. 497–504. Traditionally, such micropower amplifier designs were unable to provide large output currents while still maintaining micropower consumption when quiescent. A dynamically or adaptively-biased operational amplifier has been described that attempts to overcome this problem by boosting the tail current when a differential input is applied. Degrauwe, et al, 'Adaptive Biasing CMOS Amplifiers,' IEEE Journal of Solid-State Circuits, Vol. SC-17, No. 3, June 1982, pp. 522. However, the solution presented by Degrauwe et al suffers from instability problems and requires well-matched components.

SUMMARY OF THE INVENTION

As the trend in the semiconductor industry is toward higher levels of integration in smaller products, it is essential to combine as many circuits on a single silicon chip as possible. The inability of transistors fabricated using conventional low voltage CMOS processes to support voltages higher than 5V necessitates fabricating high voltage and low voltage circuits on separate ICs. Thus, additional silicon chips are required in most systems, lowering reliability, raising cost and increasing system size. A high voltage output circuit compatible with sub micron device geometries and oxides that avoids large gate-to-drain capacitances is therefore needed. Such an output circuit would enable the integration of output circuit functionality on state-of-the-art digital/analog ICs without diminishing reliability or integration density.

The present invention provides high voltage amplifiers and output circuits which can be fabricated in commonly available digital IC fabrication processes that typically support only low voltages. In one aspect of the present invention, voltage limiting devices present in typical IC fabrication processes are used to construct high voltage circuitry. Thus, either parasitic zener diodes or intrinsic drain-to-well zener diodes are used to limit the voltage across individual transistors. The voltages dropped across a cascade of thin gate oxide transistors can be added to form an output voltage. This output voltage can be greater than the standard tolerance of transistors in any particular CMOS fabrication process. The output voltage of ICs constructed according to the present invention is limited only by the well-to-bulk breakdown voltage of the CMOS process used to fabricate the IC. Current well-to-bulk breakdown voltages are approximately 40V.

In a second aspect, the present invention relates to an electrical apparatus, preferably in an integrated circuit form, that is controlled by low voltage signals in order to drive a high voltage output. The apparatus can be fabricated using low voltage CMOS processes and is configured such that the gate oxide transistors are subjected to a voltage within the standard tolerances of the low voltage process, and, in combination, the transistors associated with such gates are capable of driving output voltages in excess of the standard tolerances of the low voltage process.

In a third aspect, the present invention provides a high voltage driver circuit having a cascade of low voltage current mirrors that drive the output. The voltage across each current mirror stage is limited to a fraction of the total voltage drop. These current mirror stages can be biased by a high voltage current source.

In a fourth aspect, the present invention provides a current source capable of sustaining high voltages. This high voltage current source is comprised of a high voltage parasitic field oxide or cascode transistor that permits high voltage operation and a thin gate oxide transistor that allows the high voltage current source to be controlled by low voltage signals. Multiple high voltage current sources can be combined with a cascade of low voltage current mirrors to create a high voltage driver circuit of the present invention.

In a fifth aspect, the present invention includes a differential amplifier that provides low voltage control signals to the high voltage output stage. Quiescent current consumption from the high voltage power supply is substantially reduced due to the inclusion of bias current shunting transistors in the differential amplifier.

One advantage of the high voltage output circuit of the present invention is that it provides an inexpensive implementation of high voltage driver circuits that can be monolithically integrated on the same substrate as low voltage CMOS circuitry. The high voltage circuitry can be used in applications in which high voltage outputs are needed, such as flat panel display drivers, telecommunication ICs, EPROM/EEPROM memory devices and power control circuits. Circuits described in the present application can be used to implement DC-to-DC converter circuitry, voltage regulation and high-low driver circuits. The output voltages of those circuits will be capable of exceeding the standard voltage restrictions of the semiconductor fabrication technology.

A second advantage of the present invention is that the low voltage components and thin gate oxides (less than 200 angstroms) of the high voltage circuits are not required to sustain voltages above 5V. Previous attempts at designing high voltage amplifiers using low voltage processes required relatively thick gate oxides (greater than 400 angstroms) to prevent electron tunneling, avalanche breakdown and other detrimental effects. The cascadable output stage of the present invention permits flexibility in choosing output voltage ranges (from 5V to greater than 40V) and performance characteristics. The present invention places no limit on the thinness of the transistor gate oxide beyond that which is necessary for standard low voltage operation. Thus, the present invention is applicable to much smaller feature size fabrication processes than previous attempts at implementing high voltage amplifiers.

A third advantage of the present invention is that low voltage CMOS processes currently permit the design of circuits that have smaller transistor sizes, higher speeds and lower power requirements than conventional high voltage processes. Thus, since the circuits described herein can be fabricated in standard CMOS processes, the present invention improves integration density, performance and power consumption. Also, digital microprocessor and signal processing circuitry can be fabricated at much higher density in commodity low voltage CMOS processes than with specialty high voltage CMOS processes, allowing the integration of sophisticated digital and analog signal processing circuits onto the same integrated circuit.

A fourth advantage of the present invention is that less expensive conventional low voltage CMOS processes can be employed when integrating the present high voltage output circuits. Currently, typical high voltage ICs are fabricated using specialized high voltage CMOS processes that are more expensive per chip to fabricate than the commodity digital CMOS process utilized by the present invention. The present invention can eliminate the need to fabricate high voltage circuits using special high voltage semiconductor fabrication processes.

A fifth advantage of the present invention is that the output stage signals from the present amplifiers can be generated by a differential amplifier that acts to limit the quiescent current draw from the high voltage power source. This feature is particularly advantageous in portable applications in which power consumption is a concern.

Other advantages and aspects of the present invention will become apparent upon review of the detailed description of the preferred embodiment, the figures and the claims.

PREFERRED EMBODIMENT

The high voltage output circuits of the present invention are capable of driving large capacitive loads (typically 10pF to 100pF) with fast rise/fall times (typically less than 1 microsecond). Also, driver circuits constructed according to the present teachings may employ bias current shunting transistors to reduce quiescent current consumption. The amplifiers described herein may use parasitic devices present in conventional low voltage CMOS fabrication processes to attain high output voltages without exceeding the voltage specifications of standard CMOS transistors. The output stage of the present invention can attain an output voltage range several times greater than the maximum specified voltage for the standard transistors of the fabrication process with which the amplifier is constructed.

Standard CMOS fabrication processes are not typically used to implement amplifiers capable of driving large (>100pF) external loads at the high voltages (>10V) needed for many applications, such as flat panel LCD drivers, telecommunication ICs, medical devices and nonvolatile semiconductor memories. Typical CMOS FETs break down at less than 10V due to the zener action of the FET drain, punch-through in short channel FET devices and oxide insulator failure due to hot electron, tunneling, breakdown and trapping effects. These effects are described in Chen and in Sze.

Figure 1:
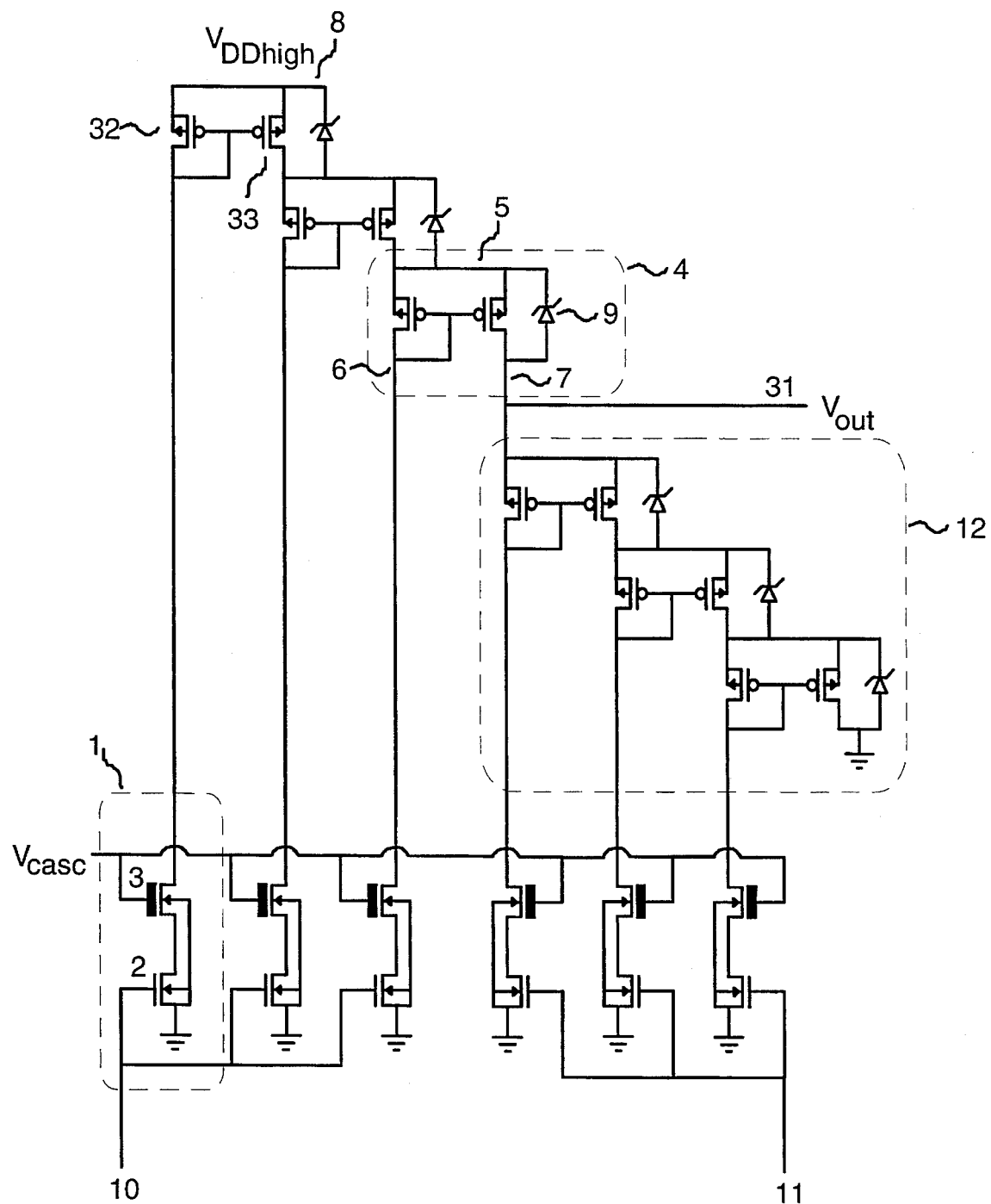
FIG. 1 is a detailed schematic of a high voltage output circuit. The high voltage output circuit uses a cascade of current mirrors that have separate well-to-bulk terminals to achieve a wide output voltage range.

A high voltage output circuit incorporating the present invention is shown in FIG. 1. One repeated element of this circuit is a high voltage current source circuit (1). The high voltage current source is formed by two n-channel FET transistors (2,3), the first (2) of which is a polysilicon gate device that is constructed using thin oxide between the gate and substrate. The second transistor (3) is a parasitic field oxide transistor. As those skilled in the art will understand, a distinction is made herein between thin gate oxide FETs and field oxide FETs, both of which are found in typical CMOS processes.

Figure 2:
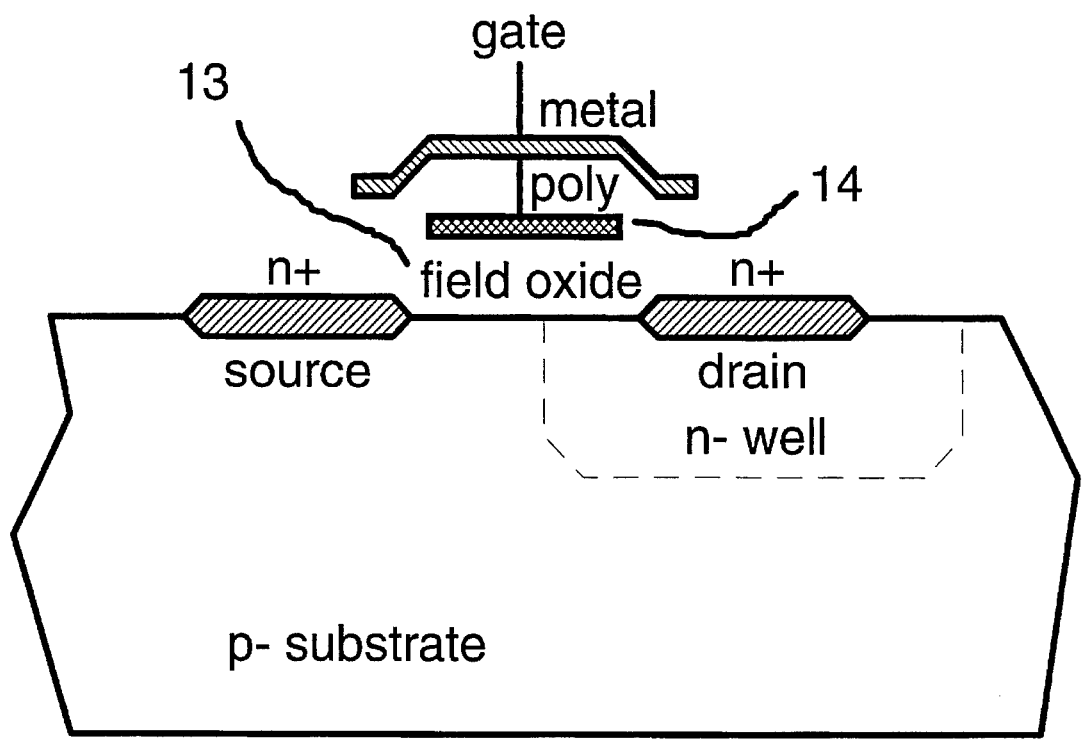
FIG. 2 is a physical cross section of a parasitic field oxide FET that can be used in the high voltage output stages of FIGS. 1 and 5 and also in the high voltage switch of FIG. 7.

A cross-section of the field oxide transistor (3) is shown in FIG. 2. This device is compatible with most CMOS fabrication processes. Referring to FIG. 2, the source terminal is a heavily doped implant that is typically used as the source or drain terminal of a standard thin gate oxide FET. The gate terminal of the field oxide FET of FIG. 2 is formed by two stacked electrodes that are electrically connected together. The lower gate electrode is a polysilicon construction and is typically used as the gate terminal of conventional thin gate oxide FETs. But, in contrast to conventional thin gate oxide FETs, the gate electrode and channel region or substrate of the field oxide FETs used in the present invention are separated by a thick field oxide. In a typical CMOS fabrication process, thin gate oxide covers the standard thin oxide transistor channels and the thicker field oxide is found everywhere else on the IC. The term 'field oxide' is defined herein as any oxide or insulator that is thicker than the thin gate oxide of the particular fabrication process. Since the polysilicon gate cannot overlap the source and drain diffusions, an upper metal electrode, typically constructed of aluminum, overlaps the lower gate electrode and overlaps the source and drain implant areas. By raising the voltage of the gate terminal, the field oxide channel region between the source and drain terminals can be inverted to conduct current from the source to the drain.

The drain region of the field oxide FET used in the examples described herein have a heavily doped region resembling the source terminal, except that a well implant has been added that completely surrounds the drain implant. Parasitic well-to-bulk diodes in typical CMOS fabrication processes can sustain a reverse bias of over 40V. The drain of the field oxide FET is limited in voltage by the parasitic well-to-bulk diode breakdown voltage, which is typically about 40V. As used herein, the term 'high voltage' is defined as a voltage that is greater than conventional transistor voltage limits for the given semiconductor fabrication process, but is less than the parasitic well-to-bulk diode breakdown voltage.

Referring to FIG. 2, the field oxide (13) acts as the gate oxide of the field oxide transistor. The polysilicon electrode beneath the middle portion of the field oxide FET (14) reduces the transistor threshold since the thickness of field oxide beneath polysilicon is usually less than that found under metal electrodes.

Although the transistor of FIG. 2 has a high threshold voltage (i.e. greater than 5V) due primarily to the thick oxide, it is being used in the present invention as a cascode transistor. Examples of cascode transistors are described in P. E. Allen and D. R. Holberg, CMOS Analog Circuit Design, Holt, Rinehart and Winston, New York, 1987, p. 233. Therefore, the high threshold voltage of the field oxide transistor (3) is not a hindrance for many applications of the present examples. The gate voltage applied to all field oxide FETs in the present invention can be a constant high voltage, $V_{casc}$, which voltage is above the threshold of the field oxide FET, typically 10V to 20V. As a cascode transistor, the parasitic field oxide FET only passes the control current of the first n-FET (2). The field oxide FET (3) should be designed such that the saturation current of FET (3) is larger than the maximum current that can be conducted through control FET (2), given a field oxide FET gate voltage of $V_{casc}$. Thus the current passed by FETs (2) and (3) is limited by the thin gate oxide FET (2) and hence controlled by the low level gate voltage of FET (2). The advantage of this pull-down design over those described by Parpie et el. and Declercq et el. is that no thin gate oxides are subjected to high voltage drops and no large control gate-to-drain capacitances are necessary.

The term 'field oxide FET' as used herein is defined as any parasitic FET structure that is constructed with a gate oxide thicker than the thin gate oxide of the typical fabrication process FETs. The exact layout of the source, drain and gate electrodes depends upon the application, as do the choice of electrode layers to use as the gate terminal. Multilayer metal and polysilicon processes are available with which any combination of layers can be used as the gate. Additional implants compatible with conventional CMOS fabrication processes may also be used to modify thresholds, control channel width, etc., depending on the application. Also, transistor breakdown by the punch-through effect can be avoided by increasing the length of the field oxide FET channel, typically to a few microns. J. Y. Chen, CMOS Devices and Technology for VLSI, Prentice Hall, Englewood Cliffs, N.J., 1990. Those skilled in the art will recognize that numerous material and layout modifications to the embodiment described herein are possible that will not affect functionality.

The term 'well FET', as used herein, is defined as a FET that has a well implant for its bulk terminal (i.e. a p-channel transistor in an n-well process is a well FET). The term 'native FET' is used to describe a FET that has the substrate for its bulk terminal (i.e. a n-channel transistor in a n-well process). The terms 'well' and 'native' can be added to the name of a circuit structure, e.g. 'well current mirror' or 'native differential pair', to indicate the type of transistor used in the circuit structure. This terminology is chosen since the present invention can be fabricated in either n-well or p-well CMOS fabrication processes.

FIG. 1 shows a high voltage output section fabricated using an n-well process. Thus, in this embodiment of the present invention the p-FETs are 'well FETs' and the n-FETs are 'native FETs.' Referring to FIG. 1, the output pull-up section of the high voltage output circuit comprises a cascade (i.e. a series connected chain) of p-channel (i.e. 'well') current mirrors (4). A current mirror is a standard analog circuit element that creates an output current in proportion to an input current. Examples of a number of different types of current mirrors that may be used with the present invention can be found in Allen and Holberg. Each current mirror has an upper rail terminal (5), a input current terminal (6) and a output current terminal (7). The upper rail terminal of the top or first current mirror in the cascade is connected to one terminal of a two terminal high voltage output power source, $V_{DDhigh}$ (8), which power source is typically 5V to 40V. The voltage $V_{DDhigh}$ herein is arbitrarily referenced to electrical ground. Each current mirror exists in its own well implant that can withstand a high voltage to ground (i.e. up to the well-to-bulk diode breakdown voltage, which is typically above 40V). Each FET of the current mirror has a source, drain, gate and bulk terminal. The bulk terminals of the FETs in one current mirror are typically also the common well for that current mirror.

The size of the input current FET (32) of the current mirror is usually smaller than the output current FET (33). The output current FET (33) must provide significant current to the output electrode (31) while the input current FET (32) is used only to provide the gate voltage of the output current FET (33). Those skilled in the art will perceive numerous modifications that can be made to this circuit, including tailoring the transistor sizing of the current mirrors to obtain application specific performance objectives. These size modifications are considered to be within the scope of the present invention.

Referring again to FIG. 1, the output current terminal of the top current mirror of the pull-up cascade is connected to the upper rail of the immediately following current mirror in the cascade. Those skilled in the art may modify the cascade by inserting additional series components that can add functionality or tailor operation of the present circuits to a given application. These modifications are also considered to be within the scope of the present invention. Additional current mirrors are connected in a similar fashion to create the upper cascade, i.e., the output current terminal of one current mirror is connected to the upper rail terminal of the immediately following current mirror. The last current mirror of the upper cascade has its output current terminal connected to the output electrode, $V_{out}$ (31), of the output circuit.

Figure 3:
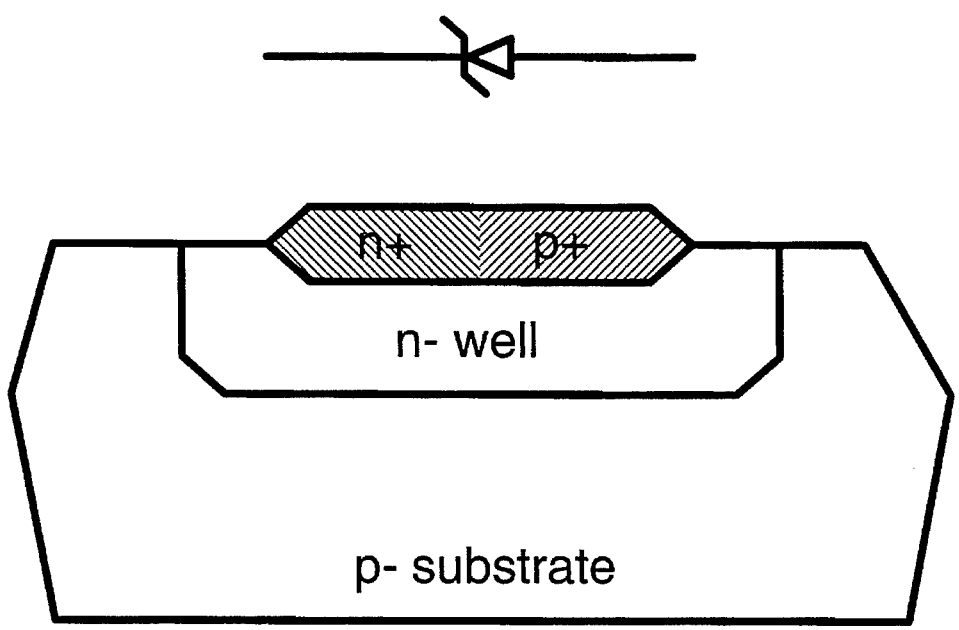
FIG. 3 is a physical cross section of a parasitic zener diode that can be used as overvoltage protection in the high voltage operation amplifier.

Each current mirror stage drops some of the high voltage output across it. The parasitic zener diodes (9) provide protection against excessive drain-source voltage that can cause device failure. Referring to FIG. 3, the parasitic zener diode for a n-well process can be constructed by placing an n+ implant in contact with a p+ implant in an n-well. Since these parasitic zener diodes have a zener breakdown of about 3V to 5V, a parasitic zener diode connected between the upper rail terminal and the output current terminal of each current mirror will limit the maximum source-drain voltage drop of each of the current mirror stages in the cascade.

The zener diodes (9) shown in FIG. 1 are not essential to practice the invention, however. Those skilled in the art will recognize that the reverse biased drain-to-well diode of each transistor in the current mirror has its own parasitic zener breakdown voltage (typically about 5V to 10V) that can provide moderate overvoltage protection without the use of an additional parasitic zener diode, such as one shown in FIG. 3. Also, those skilled in the art will recognize that a voltage limiting effect can result from breakdown, punch through, tunneling and other effects, as described by Chen and Sze. The advantage of not including the parasitic zener diode of FIG. 3 in high voltage circuits of the present invention is that the number of current mirror stages can be reduced for a given output voltage range. Thus, as used herein, the term 'zener diode' refers either to parasitic zener diodes such as the one shown in FIG. 3 or to the intrinsic drain-to-well zener diode of the current mirror FETs.

The zener diodes limit the total voltage that can be dropped across each of the cascaded current mirrors. By cascading two or more current mirror stages, the full voltage range from ground to $V_{DDhigh}$ can be covered. The number of cascaded current mirror stages needed for a particular application is determined simply by dividing $V_{DDhigh}$ (i.e. the high voltage power source voltage) by the breakdown voltage of the zener diodes for the particular fabrication process. A typical number of current mirror stages in a cascade is 3 or 4, although those skilled in the art will recognize that more or less may be appropriate in different circumstances. Additionally, the number and type of pull-up and pull-down current mirrors need not be the same and may be customized for a particular application. As used herein, the pull-up current mirrors are connected between $V_{DDhigh}$ and $V_{out}$ and the pull-down current mirrors are connected between $V_{out}$ and electrical ground. Those skilled in the art will also recognize that the output circuits of the present invention are not restricted to n-well fabrication processes, as all of the voltages can be reversed and all n and p sections swapped for a p-well fabrication process.

Referring again to FIG. 1, the current input terminals of the current mirrors are connected to a set of high voltage current sources that source (i.e. generate) the control currents for the pull-up cascade of current mirrors. The common control signal on line (10) sets the current level for the pull-up section of the output circuit. The pull-down section of the output circuit (12) is also comprised of cascaded current mirrors that are similarly biased by a second set of high voltage current sources. The upper rail terminal of the top current mirror of the pull-down cascade of current mirrors is connected to the output terminal of the amplifier. The output current terminal of the last current mirror in the pull-down cascade is connected to electrical ground. Electrical ground is arbitrarily chosen herein to be the pull-down voltage. When the pull-down cascade is activated by a low voltage control signal on line (11), the output voltage will be pulled down to electrical ground. Thus, as used herein, electrical ground is chosen to be the second of the two terminals of the high voltage power source. Those skilled in the art will recognize that the pull-down voltage need not be electrical ground, and can be chosen to be other voltages without affecting the function of the circuit. Low voltage control signals on lines (10) and (11) control the current flowing in the pull-up and pull-down current mirror cascades, enabling low voltage signals to control the high voltage output, $V_{out}$ (31).

The particular type of current mirrors used in the cascaded pull-up and pull-down section of the output circuit of FIG. 1 can be chosen according to circuit specifications for each particular application of the present invention. As shown in Allen and Holberg, a number of different current mirror circuits are described that are appropriate for use with the present invention, for example, cascode (p. 233), Wilson (p.235) or other current mirror circuits can be implemented. Some types of current mirrors, especially those with improved voltage range (see e.g., Allen and Holberg, p. 226), require additional input current terminals per current mirror. In those cases, additional high voltage current source circuits may be needed.

The high voltage output section of FIG. 1 has two control voltage lines (10,11), with line (10) controlling the pull-up cascade and line (11) controlling the pull-down cascade. These two lines (10,11) carry low voltage pull-up and pull-down signals that control the output signal. Those skilled in the art will recognize that a variety of pre-amplification circuits can be used with the present invention to generate the control signals on lines (10) and (11). For example, to implement a high-low output driver circuit, an inverter can be used to generate the pull-up and pull-down control signals on lines (10) and (11). For a high voltage differential amplifier, analog signals can be generated from a differential pair. Conventional differential pairs can be employed, and some appropriate examples are described in Allen and Holberg, p. 274. Operational amplifiers can be constructed using the present invention as well.

Figure 4:
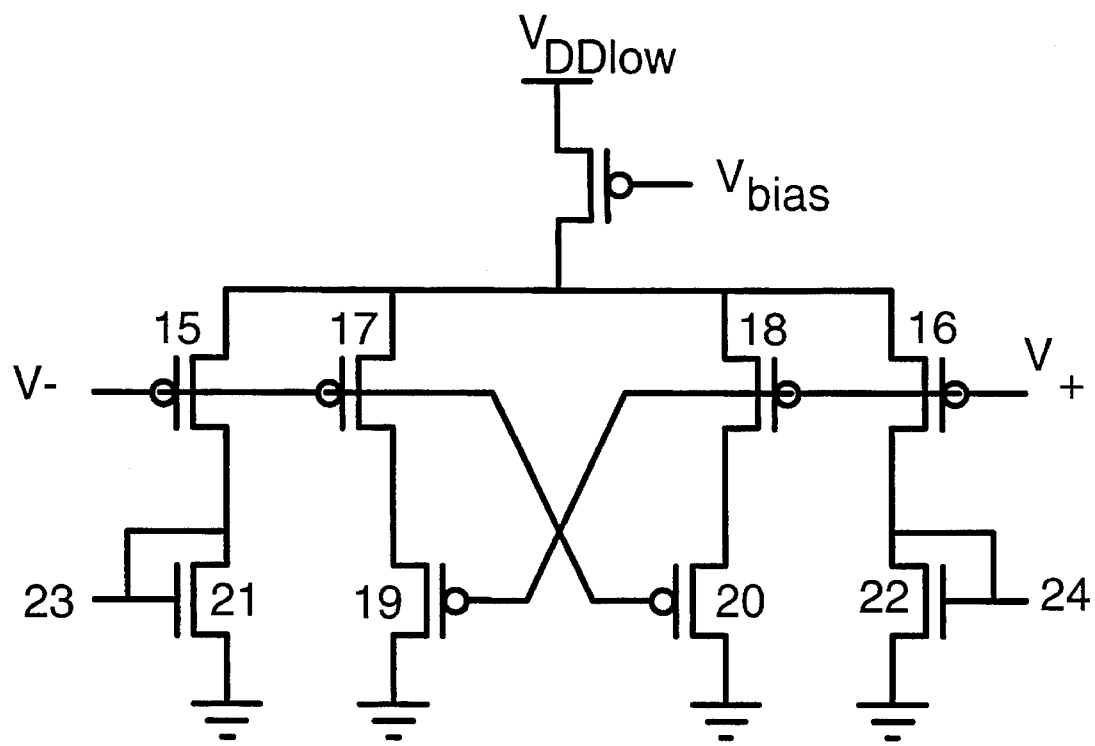
FIG. 4 is a detailed schematic of a differential input circuit that can be used in conjunction with the output stages of FIGS. 1 and 5 to form a differential operational amplifier with high voltage output.

Since many applications require low power operation, a current-limiting pre-amplification circuit, such as a reduced current differential bias circuit, can be used to generate the control voltages on lines (10) and (11) shown in FIG. 1. To reduce quiescent current draw from the high voltage output power supply, a low power biasing or bias current shunting circuit can be constructed and an appropriate example is shown in FIG. 4. Preferably, in the present invention, the bias current shunting circuit of FIG. 4 is used to generate signals for driving a push-pull output circuit.

The bias circuit in FIG. 4 is comprised of a conventional differential pair, i.e. FETs (15) and (16), with two additional current shunt paths from the bias p-FET. Current for the differential pair is provided by a p-FET from a low voltage power source, $V_{DDlow}$, which is typically 3V to 5V. If the shunt transistors (17, 20) are designed to be much larger than the differential pair transistors (15, 16), when the input voltages on the gates of differential pair FETs (15) and (16) (V+ and V-) are the same, the majority of the bias current is shunted through the middle branch shunt FETs (17–20). The shunted current is collected by the electrical ground terminal in FIG. 4, although those skilled in the art will recognize that other circuits or current collecting voltages are possible.

Figure 5:
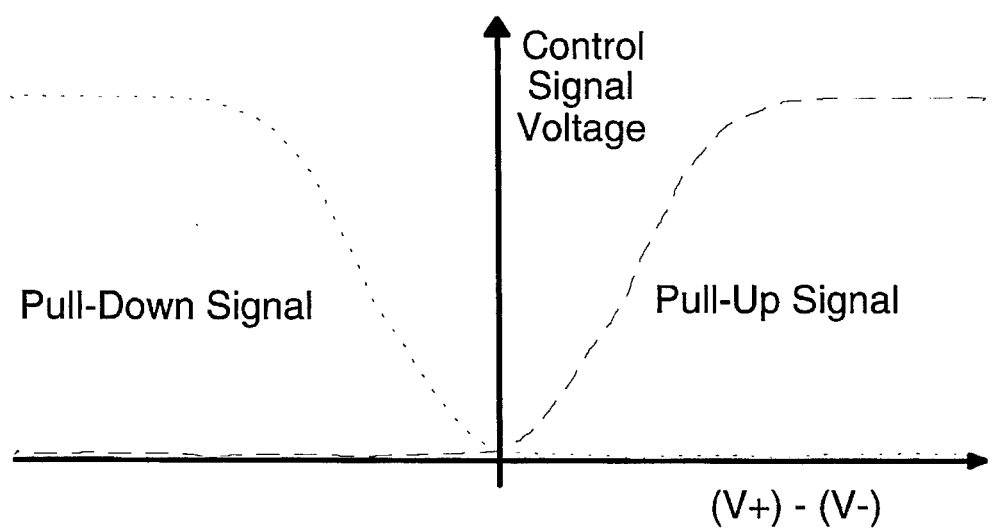
FIG. 5 is a graph of the pull-up and pull-down control signal voltages generated by the circuit of FIG. 4 in response to a varying differential input. The pull-up and pull-down signals both drop to low levels when the differential input voltage is zero.

Two FETs (21, 22) are used to collect the current through the outside branch FETs. These FETs (21, 22) convert the current flowing through the outer branch (i.e. differential pair) FETs (15,16) into pull-up and pull-down signals. An input voltage difference causes current flow through the added n-channel FETs (21–22). The current flow arising from an input voltage difference drives the output pull-up and pull-down circuits through lines (23) and (24). In order to add this quiescent current limiting circuit to the high voltage amplifier of FIG. 1, lines (23) and (24) are connected to lines (10) and (11) of FIG. 1. Thus, the pull-up and pull-down signals generated by the circuit in FIG. 4 can act as the control signals for the current sources of FIG. 1. The degree of current shunting that occurs when equal voltages are applied to the two input terminals of the differential pair is determined by the ratio of transistor sizes of the middle branches to the transistor sizes of the outer branches. Referring to FIG. 5, a graph of typical control voltages on lines (23) and (24) is shown as a function of the input voltage difference (V+ minus V−).

Those skilled in the art will recognize that numerous different pre-amplifier and differential amplifier configurations can be used to generate the control signals for the high voltage current sources (1). Microchip amplifier design techniques, such as those described in M. G. Degrauwe, J. Rijmenants, E. A. Vittoz and H. J De Man, 'Adaptive Biasing CMOS Amplifiers,' IEEE Journal of Solid State Circuits, Vol. SC-17, No. 3, pp. 522–528, 1982, can be used to generate the control signals and further limit the power consumption of circuits constructed according to the present invention. Those skilled in the art will also recognize that the arrangement of the inner branch FETs can be modified while preserving the current shunting function. For example, FETs (18) and (20) can be removed from the circuit shown in FIG. 4 and the current shunting function of the inner branch FETs is maintained.

The circuit shown in FIG. 4 has advantages over conventional micropower amplifiers, such as those amplifiers shown in Allen and Holberg, p. 502, in that it has no instability problems and does not require well matched components. Those skilled in the art will realize that the control signal generating circuit described above can be used in any low power amplifier by driving an output stage with the control signals (23–24). Also, those skilled in the art will recognize that the conversion of the currents flowing through FETs (15,16) into pull-up and pull-down or control signals can be accomplished by a number of different circuits, such as resistors, current sources or an additional diode connected to FETs (15) and (16).

Figure 6:
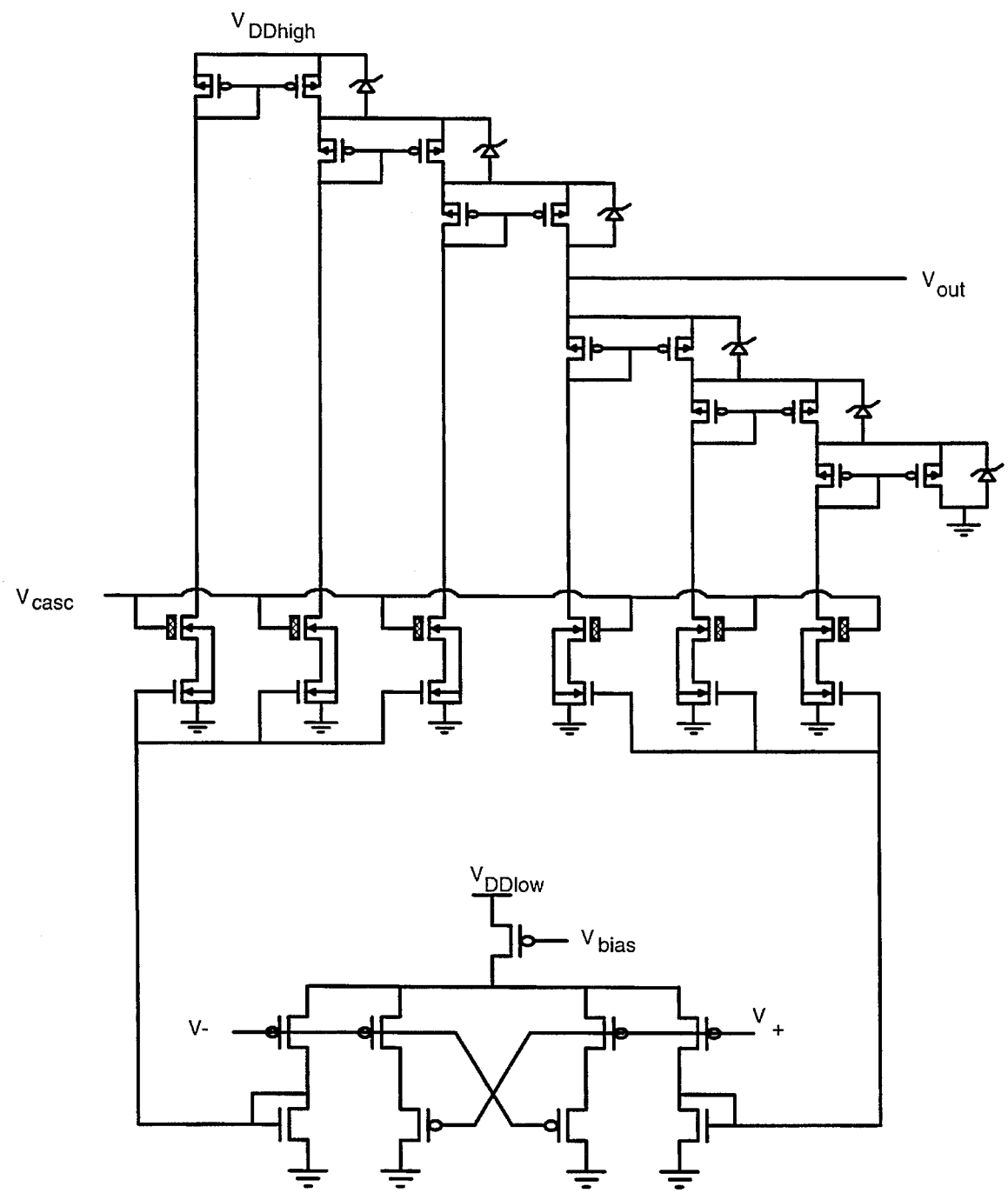
FIG. 6 is a detailed schematic of a combination of the circuits of FIGS. 1 and 4. This figure depicts a complete high voltage amplifier system that is capable of amplifying the difference between two signals, while limiting current draw from the high voltage power source.

Combining the circuits of FIG. 1 and FIG. 4 results in a differential amplifier with high voltage output and low quiescent power draw (i.e. consumption) from the high voltage power supply and is shown in FIG. 6. When the differential input voltages (V+) and (V−) are equal, the quiescent output current is limited approximately to the peak output current divided by the ratio of the inner branch FET size to the outer branch FET size. In this sense, the term 'limited' refers to any reduction in quiescent current draw from the peak output current level. The quiescent current can, in practice, be limited to a range anywhere from nearly the peak output current to well below one hundredth of the peak output current. Those skilled in the art will recognize numerous modifications that can achieve the same goal of limiting quiescent current using the circuit techniques discussed herein.

This circuit is ideal for driving large capacitive loads like those found in LCD driver applications to display video image information. Typical passive or active LCD applications have a large array of pixels that are addressed by a grid of row and column electrodes. These driving electrodes activate the liquid crystal material to produce variable light output in response to the video image information. For typical screen resolutions, over a thousand row and column electrodes must be driven to create a video image on the display. The present invention allows the low cost integration of power efficient amplifiers that can reliably drive the high voltages onto the row and column electrodes.

Figure 10:
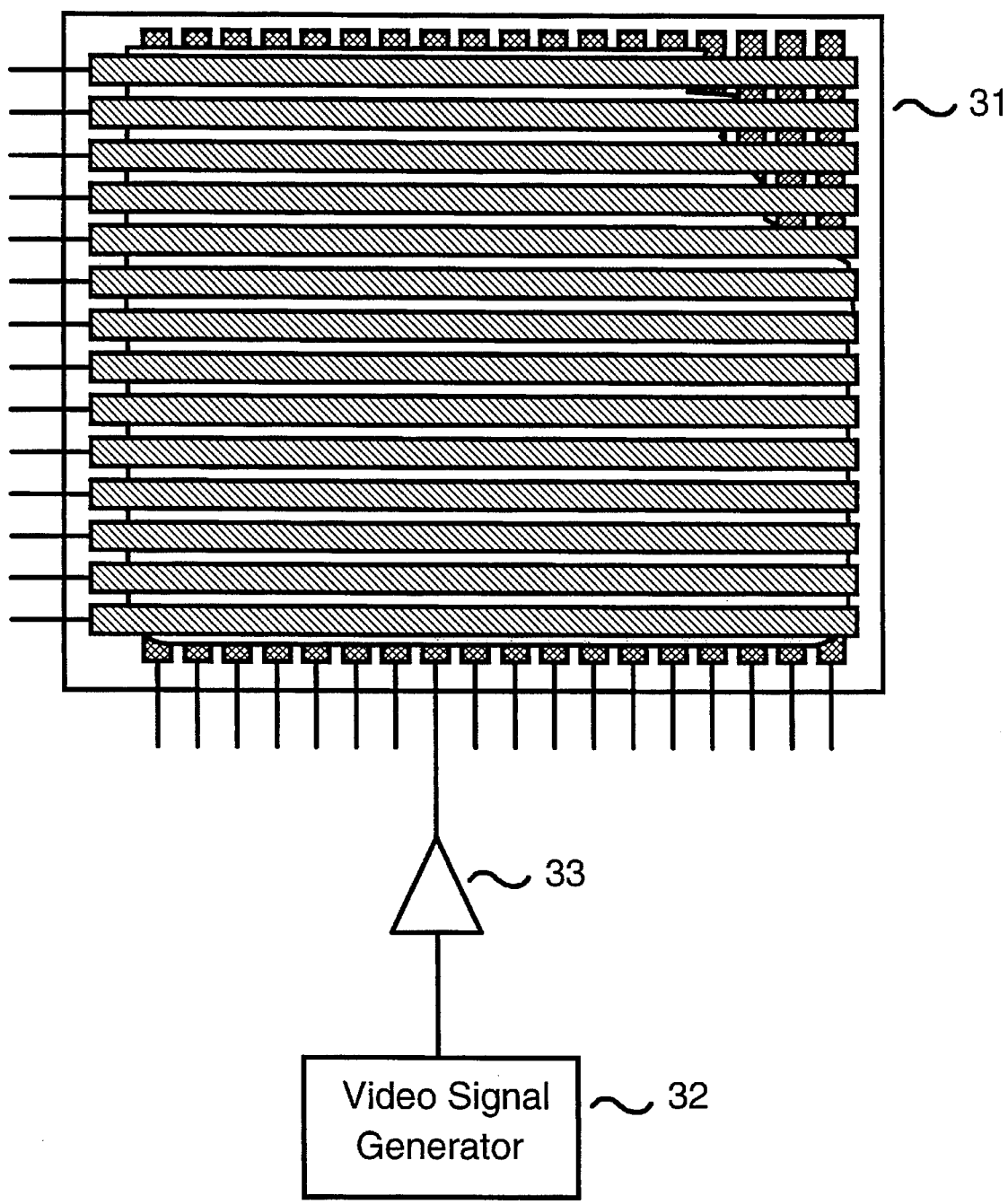
FIG. 10 is a block diagram of a liquid crystal display system incorporating the high voltage amplifier shown in FIG. 6.

An example of the use of the present invention in a liquid crystal display system is shown in FIG. 10. FIG. 10 is a schematic that shows a LCD panel (31) and the circuitry associated with driving one column of the display. A voltage representative of the video pixel information can be generated from the direct video information or by using conventional video image processing circuitry (32). In applicant's preferred embodiment, a linear transform of the video pixel information is generated and driven onto the LCD electrodes using high voltage amplifier circuits (33) constructed according to the present invention. Examples of the preferred use of the present invention in an LCD system are described in the copending U.S. patent application Ser. No. 08/186,372.

Figure 7:
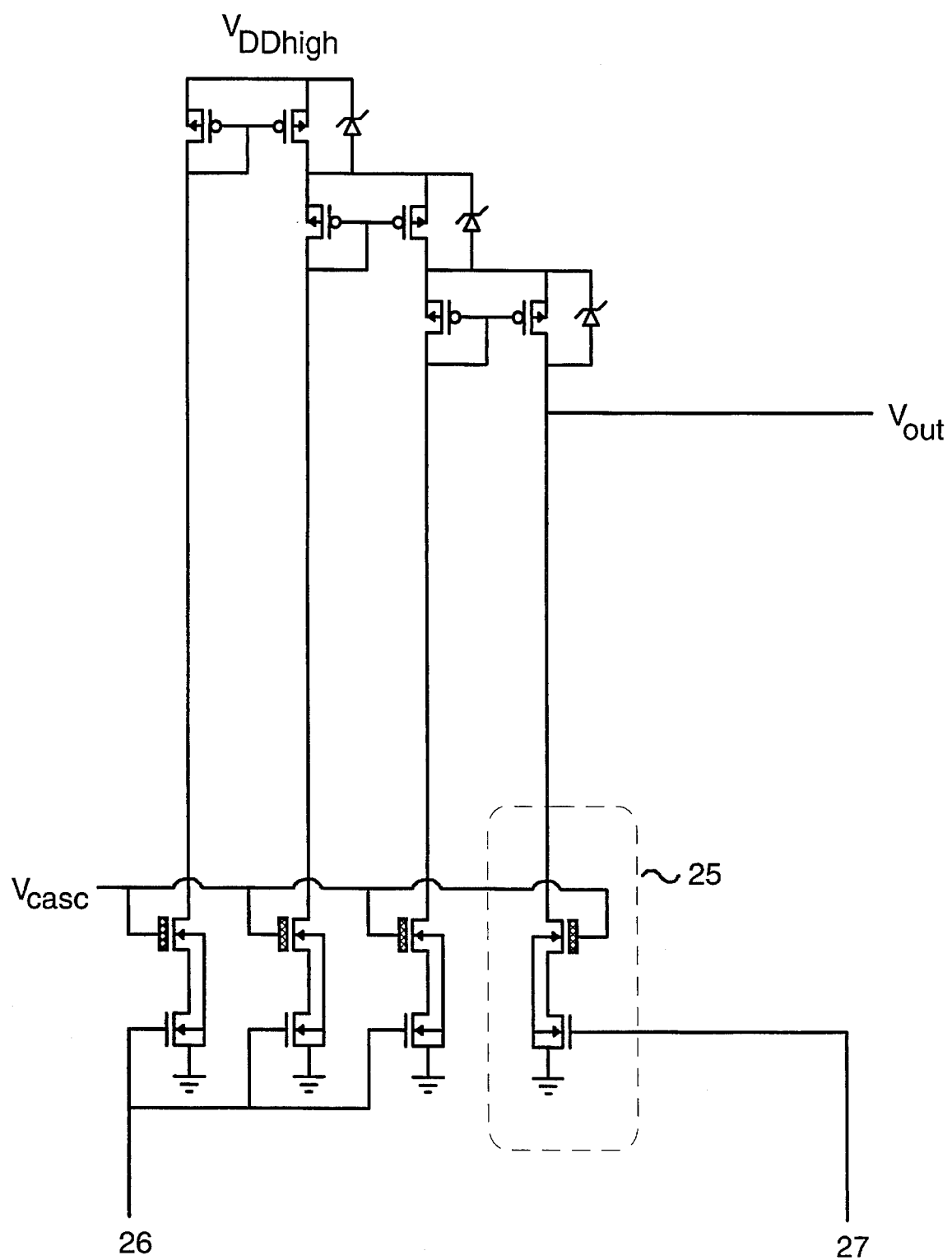
FIG. 7 is a detailed schematic of a second high voltage output circuit. The high voltage output circuit has a series of cascaded p-FET current mirrors as a pull-up, as in FIG. 1. The pull-down portion of the output circuit is formed from a high voltage n-FET in a cascode configuration.

A variation on the high voltage output circuit of FIG. 1 is shown in FIG. 7. The high voltage output pull-down (25) is a high voltage field oxide FET that acts as a cascode transistor and a series connected low voltage transistor that controls the current level of the pull-down section. In this example, the high voltage field oxide FET must be large enough to have a saturation current greater than the peak pull-down current, as is the case with the high voltage current sources described above. Once again, low voltage control signals (26–27) are used to control the high voltage output.

Figure 8:
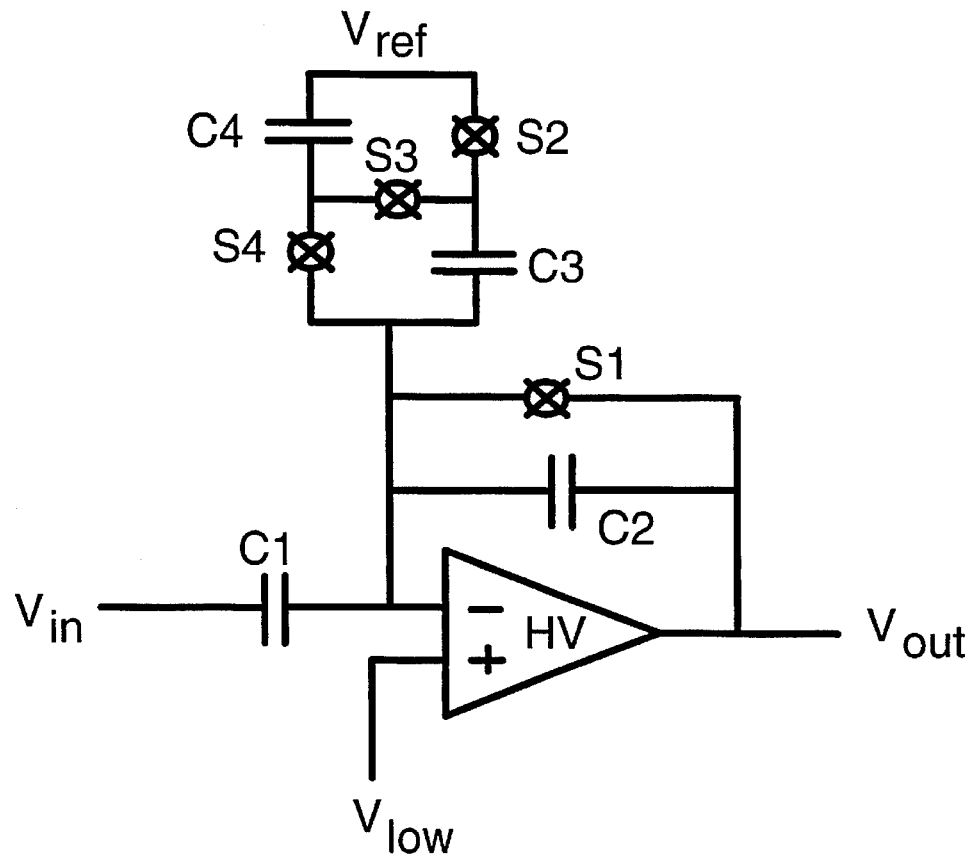
FIG. 8 is a high voltage switched capacitor inverting amplifier, employing a high voltage operational amplifier of the present invention and a high voltage switch, S1, that is detailed in FIG. 9.

A switched capacitor amplifier utilizing the present invention is shown as an example of the application of the high voltage amplifier. The configuration shown in FIG. 8 is an offset compensated switched capacitor inverting amplifier. Examples of these types of circuits generally can be found in R. Gregorian and G. C. Temes, Analog MOS Integrated Circuits for Signal Processing, John Wiley & Sons, New York, 1986. In applicant's preferred embodiment, capacitors C3 and C4 are twice the size of C2 and act to eliminate the offset of the amplifier. During the reset phase of the switched capacitor clocking, S1, S2 and S4 are closed, while S3 is open. During the amplify phase of the switched capacitor clocking, switches S1, S2 and S4 are opened and S3 is closed. Capacitors C3 and C4 inject the desired amount of charge onto the negative terminal of the amplifier to remove the offset voltage effect from the output. Note that switch S1 has one terminal that may exceed the voltage limits of the normal FETs. Therefore, a switch that can sustain high (greater than 10V) voltages is required to implement this circuit.

Figure 9:
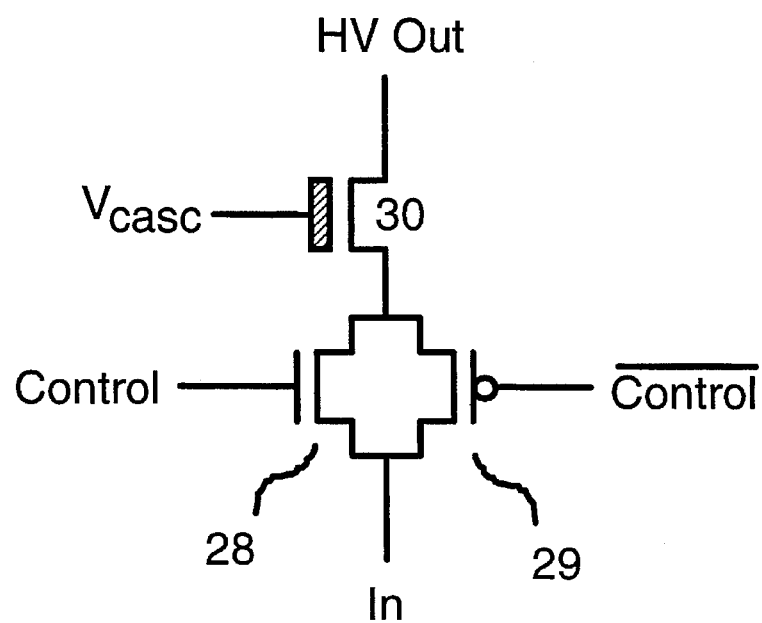
FIG. 9 is high voltage switch constructed from a high voltage field oxide FET and two conventional low voltage FETs. This special switch can be used as the reset switch S1 of the high voltage amplifier of FIG. 8.

Referring to FIG. 9, a high voltage switch is shown that is appropriate for use with the circuit in FIG. 8. The switch action is performed by a conventional p-FET (28) and n-FET (29) switch pair. A high voltage cascode FET (30), as described above, acts to buffer one terminal of the switch, so that the switch can be connected to high voltages. The high voltage cascode transistor (30) in this example cannot conduct unless its source voltage is at a low voltage, typically around 1V. For this reason, the positive input to the high voltage amplifier is set at this low voltage, $V_{low}$. When the amplifier is being reset by closure of switch S1, the inverting input of the amplifier will be driven to approximately $V_{low}$. Thus $V_{low}$ should be set low enough to permit conduction in the high voltage cascode transistor. Note that the differential pair of the high voltage amplifier, shown in FIG. 4, is comprised of p-FETs that can function properly at low input voltages. Those skilled in the art will recognize that conventional high voltage switches also can be used to practice the present invention.

The described examples and figures are intended to be illustrations of the present invention and should not be interpreted as limitations. Those individuals with ordinary skill in the art will recognize that numerous changes can be made to the described embodiment without departing from the spirit of the present invention.

I claim:

1. An apparatus for displaying video image information on a liquid crystal display, comprising:

(a) a cascade of at least two well current mirrors having at least a first and last current mirror, wherein each current mirror of the cascade has an output current terminal, an upper rail terminal and at least one input current terminal;

(b) means for connecting the output current terminal of each respective well current mirror in the cascade, except for the last well current mirror in the cascade, to the upper rail terminal of the well current mirror immediately following in the cascade;

(c) an output power source with at least a first and second terminal;

(d) means for connecting the upper rail of the first well current mirror in the cascade to the first terminal of the output power source;

(e) means for connecting the output current terminal of the last well current mirror in the cascade to the second terminal of the output power source;

(f) a plurality of driving electrodes for activating the liquid crystal display to display an image;

(g) means for connecting at least one of the driving electrodes of the liquid crystal display to the upper rail terminal of one of the well current mirrors in the cascade;

(h) current source means for generating a current, wherein the current source means is connected to the respective input current terminals of the well current mirrors in the cascade; and (i) means for controlling the current source means with control signals representative of the video image information.

2. An apparatus as in claim 1 wherein at least one of the well current mirrors in the cascade is selected from a group consisting of a Wilson current mirror and a cascode current mirror.

3. An apparatus as in claim 1 wherein the current source means is capable of sustaining a high voltage.

4. An apparatus as in claim 1 further comprising:

(a) a zener diode;

(b) means for connecting the zener diode between the upper rail terminal and the output current terminal of at least one of the well current mirrors.

5. An apparatus as in claim 1 wherein the current source means for generating a current comprises a plurality of native current sources connected to the input current terminals of the well current mirrors in the cascade.

6. An apparatus as in claim 5 wherein at least one native current source comprises:

(a) a cascode field effect transistor having a substrate, a gate terminal, a source terminal and a drain terminal, wherein a voltage greater than the cascode field effect transistor threshold is applied to the gate terminal; and (b) a thin gate oxide field effect transistor having a gate terminal, a source terminal and a drain terminal, wherein the source terminal is connected to electrical ground, the drain terminal is connected to the source terminal of the cascode field effect transistor and control signals representative of the video image information are applied to the gate terminal of the thin gate oxide field effect transistor.

7. An apparatus as in claim 6 wherein the cascode field effect transistor has a field oxide layer separating the gate terminal and the substrate.

8. An apparatus as in claim 1 further comprising preamplification means for generating the control signals representative of the video image information, wherein the control signals are applied to the current source means.

9. An apparatus as in claim 8 wherein the preamplification means for generating control signals representative of the video image information is comprised of a differential pair of field effect transistors.

10. An apparatus as in claim 8 wherein the preamplification means for generating control signals representative of the video image information further comprises current shunting means for limiting quiescent current from the output power source.

11. An apparatus for generating an output signal on an output electrode, comprising:

(a) a first set of current sources; and (b) a first cascade of current mirrors having at least a first and second current mirror, wherein the second current mirror may be the last current mirror in the first cascade, each current mirror having an upper rail terminal, at least one input current terminal and an output current terminal, wherein the current sources are connected to the well current mirrors in the first cascade, the upper rail terminal of the first current mirror of the first cascade is connected to a first terminal of an output power supply and the output current terminal of each current mirror other than the last current mirror in the first cascade is connected to the upper rail terminal of the immediately following current mirror and wherein the output current terminal of the last current mirror in the first cascade of current mirrors is connected to the output electrode.

12. An apparatus as in claim 11 further comprising a means for generating at least one input signal whereby the input signal controls at least one current source in the first set of current sources.

13. An apparatus as in claim 11 further comprising an additional current source wherein the additional current source is connected to the output electrode.

14. An apparatus as in claim 11 wherein the first cascade of current mirrors further comprises at least one zener diode, wherein the zener diode is connected between the upper rail terminal and the output current terminal of at least one of the current mirrors.

15. An apparatus as in claim 11 further comprising a differential amplifier means for generating control signals to control current in the first set of cascaded current mirrors.

16. An apparatus as in claim 11 further comprising:

(a) a second set of current sources; and (b) a second cascade of current mirrors having at least a first and second current mirror, wherein the second current mirror may be the last current mirror in the second cascade, each current mirror having an upper rail terminal, at least one input current terminal and an output current terminal, wherein the current sources in the second set of current sources are connected to the well current mirrors in the second cascade, the output current terminal of the last current mirror of the second cascade is connected to a second terminal of the output power supply and the output current terminal of each current mirror other than the last current mirror in the second cascade is connected to the upper rail terminal of the immediately following current mirror and wherein the upper rail terminal of the first current mirror in the second cascade of current mirrors is connected to the output electrode.

17. An apparatus as in claim 16 further comprising a differential amplifier for generating control signals to control current in the first and second sets of current mirrors.

18. A circuit for driving a liquid crystal display, comprising:

(a) a bias current generating circuit;

(b) a differential pair of transistors, wherein the differential pair of transistors is connected to the bias current generating circuit;

(c) bias current shunting means for limiting quiescent current from an output power supply, wherein the bias current shunting means is also connected to the bias current generating circuit; and (d) an output stage, wherein the output stage is connected to the differential pair of transistors and to the liquid crystal display and generates an output signal in response to signals generated by the differential pair of transistors.

19. A circuit as in claim 18 wherein the bias current shunting means for limiting quiescent current from an output power supply comprises:

(a) a first, second, third and fourth transistor, each transistor having a source, a gate and a drain terminal wherein the gates of the first and fourth transistors are driven by a first input signal and the gates of the second and third transistors are driven by a second input signal, and wherein the first input signal is representative of video image information;

(b) means for connecting the bias current generating circuit to the source terminals of the first and second transistors;

(c) means for connecting the drain terminal of the first transistor to the source terminal of the third transistor;

(d) means for connecting the drain terminal of the second transistor to source terminal of the fourth terminal;

(e) means for collecting a current; and (f) means for connecting the drain terminals of the third and fourth transistors to the means for collecting a current.

20. A circuit as in claim 19 wherein the output stage comprises:

(a) a cascade of well current mirrors, wherein the cascade of well current mirrors generates an output signal;

(b) a plurality of current sources, wherein the current sources are driven by signal generated by the differential pair of transistors;

(c) means for connecting the current sources to the well current mirrors; and (d) means for applying the output signal to at least one liquid crystal display electrode.

21. A circuit for generating an output voltage in response to an input voltage, comprising:

(a) a cascade of at least two well current mirrors having at least a first and last current mirror, wherein each current mirror of the cascade has an output current terminal, an upper rail terminal and at least one input current terminal, and wherein the output current terminal of each respective well current mirror in the cascade, except for the last well current mirror in the cascade, is electronically connected to the upper rail terminal of the well current mirror immediately following in the cascade;

(b) an output power supply comprising at least a first and second terminal, wherein the upper rail of the first well current mirror in the cascade is electronically connected to the first terminal of the output power supply and wherein the output current terminal of the last well current mirror in the cascade is electronically connected to the second terminal of the output power supply; and (c) at least one current source, wherein the current source is connected to the respective input current terminals of the well current mirrors in the cascade and wherein the current source is controlled by control signals representative of the input voltage.

22. A circuit as in claim 21 wherein at least one of the well current mirrors in the cascade is selected from a group consisting of a Wilson current mirror and a cascode current mirror.

23. A circuit as in claim 21 wherein the current source is capable of sustaining a high voltage.

24. A circuit as in claim 21 further comprising at least one zener diode, wherein the zener diode is electronically connected between the upper rail terminal and the output current terminal of at least one of the well current mirrors.

25. A circuit as in claim 21 wherein at least one current source is a native current source.

26. A circuit as in claim 25 wherein at least one native current source comprises:
  (a) a cascode field effect transistor having a substrate, a gate terminal, a source terminal and a drain terminal, wherein a voltage greater than the cascode field effect transistor threshold is applied to the gate terminal; and
  (b) a thin gate oxide field effect transistor having a gate terminal, a source terminal and a drain terminal, wherein the source terminal is connected to a current collector, the drain terminal is connected to the source terminal of the cascode field effect transistor and control signals representative of the input voltage are applied to the gate terminal of the thin gate oxide field effect transistor.

27. A circuit as in claim 26 wherein the cascode field effect transistor has a field oxide layer separating the gate terminal and the substrate.

28. A circuit as in claim 21 further comprising a preamplification circuit, wherein the preamplification circuit generates the control signals representative of the input voltage, and wherein the control signals are applied to the current source.

29. A circuit as in claim 28 wherein the preamplification circuit is comprised of a differential pair of field effect transistors.

30. A circuit as in claim 28 wherein the preamplification circuit further comprises bias-current shunting transistors, whereby the bias-current shunting transistors limit quiescent current from the output power source.

31. A circuit for processing input signals into output signals, comprising:
  (a) a bias-current source;
  (b) a differential pair of transistors, wherein each differential pair transistor has a gate, drain and source, wherein the input signals are applied to the gates of the differential pair transistors, and wherein the source of each differential pair transistor is electrically connected to the bias-current source;
  (c) bias-current shunting transistors, wherein the bias-current shunting transistors are electrically connected to the bias-current source;
  (d) an output stage, wherein the output stage is electrically connected to the drain of each differential pair transistor and to an output power supply, and whereby the bias-current shunting transistors limit quiescent current from the output power supply.

32. A circuit as in claim 31 wherein the bias-current shunting transistors comprise:
  (a) a first and second transistor, each transistor having a source, a gate and a drain, wherein the gate of the first transistor is driven by a first input signal, which first input signal also drives at least one of the differential pair transistors, wherein the gate of the second transistor is driven by a second input signal, which second input signal also drives at least one of the differential pair transistors, wherein the source of the first transistor is electronically connected to the bias-current source and wherein the drain of the first transistor is electronically connected to the source of the second transistor; and
  (b) a current collector, wherein the current collector is electrically connected to the drain of the second transistor.

33. A circuit as in claim 32, wherein at least one input signal is a signal representative of video image information and wherein the output stage drives a liquid crystal display.

34. A circuit as in claim 31 wherein the bias-current shunting transistors comprise:
  (a) a first, second, third and fourth transistor, each transistor having a gate, a source terminal and a drain terminal, wherein the gates of the first and fourth transistors are driven by a first input signal and the gates of the second and third transistors are driven by a second input signal, wherein the bias-current source is electrically connected to the source terminals of the first and second transistors, wherein the drain terminal of the first transistor is connected to the source terminal of the third transistor, and wherein the drain terminal of the second transistor is electrically connected to the source terminal of the fourth transistor; and
  (b) a current collector, wherein the drain terminals of the third and fourth transistors are electrically connected to the current collector.

35. A circuit as in claim 34 wherein at least one input signal is a signal representative of video image information and wherein the output stage drives a liquid crystal display.

36. A circuit as in claim 34 wherein the current collector is selected from the group consisting of a negative power supply rail and electrical ground.

37. A circuit as in claim 34 wherein the output stage comprises:
  (a) a cascade of well current mirrors, wherein the cascade of well current mirrors generates an output signal;
  (b) a plurality of current sources, wherein the current sources are driven by signals generated by the differential pair of transistors and wherein the current sources are electrically connected to the well current mirrors; and
  (c) means tbr applying the output signal to at least one liquid crystal display electrode.

* * * * *